US006487419B1

(12) United States Patent
Freed

(10) Patent No.: US 6,487,419 B1
(45) Date of Patent: Nov. 26, 2002

(54) SYSTEMS AND METHODS FOR MANAGEMENT OF CURRENT CONSUMPTION AND PERFORMANCE IN A RECEIVER DOWN CONVERTER OF A WIRELESS DEVICE

(75) Inventor: John G. Freed, Raleigh, NC (US)

(73) Assignee: Ericsson Inc., Reseach Triangle Park, NC (US)

( * ) Notice: Subject to any disclaimer, the term of this patent is extended or adjusted under 35 U.S.C. 154(b) by 0 days.

(21) Appl. No.: 09/129,854

(22) Filed: Aug. 6, 1998

(51) Int. Cl.[7] .............................. H04B 7/00; H04B 1/06
(52) U.S. Cl. ................. 455/522; 455/234.1; 455/247.1
(58) Field of Search ................... 455/69, 522, 232.1, 455/234.1, 234.2, 247.1, 250.1, 204, 200.1; 375/345

(56) References Cited

U.S. PATENT DOCUMENTS

| | | | | |
|---|---|---|---|---|
| 5,054,052 A | | 10/1991 | Nonami | 379/57 |
| 5,179,724 A | * | 1/1993 | Lindoff | 455/76 |
| 5,656,972 A | * | 8/1997 | Norimatsu | 330/129 |
| 5,722,061 A | * | 2/1998 | Hutchison, IV et al. | 455/245.1 |
| 5,722,063 A | * | 2/1998 | Peterzell et al. | 455/287 |
| 5,732,341 A | * | 3/1998 | Wheatley, III | 455/234.1 |
| 5,778,026 A | | 7/1998 | Zak | 315/219 |
| 5,815,821 A | * | 9/1998 | Pettersson | 455/575 |
| 5,852,770 A | * | 12/1998 | Kasamatsu | 455/126 |
| 5,991,635 A | * | 11/1999 | Dent et al. | 455/517 |
| 6,009,129 A | * | 12/1999 | Kenney et al. | 375/346 |
| 6,038,428 A | * | 3/2000 | Mizusawa et al. | 455/69 |
| 6,041,081 A | * | 3/2000 | O et al. | 375/297 |
| 6,052,566 A | * | 4/2000 | Abramsky et al. | 455/67.1 |
| 6,081,558 A | * | 6/2000 | North | 250/214 AG |
| 6,223,056 B1 | * | 4/2001 | Appel | 455/561 |
| 6,298,221 B1 | * | 10/2001 | Nguyen | 455/73 |

FOREIGN PATENT DOCUMENTS

| | | | | |
|---|---|---|---|---|
| EP | 0831414 | * | 3/1998 | G06K/7/00 |
| WO | WO 97/41643 | | 11/1997 | H04B/1/06 |

OTHER PUBLICATIONS

International Search Report, International Application No. PCT/US99/1433.
CDMA/FM Low Noise Amplifer/Mixer RF9906, *RF Micro Devices*, Rev C3 971222, pp. 8–81–8–88.
PCS Low Noise Amplifier/Mixer RF9986, *RF Micro Devices*, Rev A2 971222, pp. 8–99–8–106.

* cited by examiner

*Primary Examiner*—Vivian Chin
*Assistant Examiner*—Charles N. Appiah
(74) *Attorney, Agent, or Firm*—Myers Bigel Sibley & Sajovec

(57) ABSTRACT

Methods, systems and computer program products are provide which control the operation of a receiver of a wireless device so as to reduce the power consumption of the receiver by setting the third order intercept point of a low noise amplifier based upon at least one of a strength of a signal received by the wireless device or a transmission power of a transmitter of the wireless device. Furthermore, the gain of the low noise amplifier may also be set based upon received signal strength or transmitter power. Also, the gain of an amplifier associated with a mixer of the receiver may be set based upon received signal strength or transmitter power. Preferably, multiple power modes are provided to tailor the power consumption to the operating conditions of the wireless device.

21 Claims, 3 Drawing Sheets

SYSTEMS AND METHODS FOR MANAGEMENT OF CURRENT CONSUMPTION AND PERFORMANCE IN A RECEIVER DOWN CONVERTER OF A WIRELESS DEVICE

FIELD OF THE INVENTION

The present invention relates to receiver down converters and more particularly to receiver down converters for use in radiotelephones and radiotelephone equipment.

BACKGROUND OF THE INVENTION

With ever increasing demands for increased talk time and standby time in wireless telephones, the power consumption of each circuit in the telephone can be critical to the overall performance of the telephone. Thus, it has become more important to assure that each circuit uses as little current as possible to thereby extend battery life of the telephone.

While reducing power usage in the telephone is important, this goal is generally at odds with other performance goals for the telephone. For example, as the number of wireless telephone users utilizing fixed amount of radio spectrum increase, the need to reject undesired interference can become very important. However, when operating in strong signal environments higher current is generally required by the down converter of the telephone receiver to compensate for the strong signal environment.

In particular in wireless telephone modes such as Code Division Multiple Access (CDMA) mode the linearity of the low noise amplifier, as reflected by the third order intercept point of the amplifier, may be critical to meeting the requirements of CDMA. However, increasing the third order intercept point to increase the linearity of the amplifier generally requires an increase in the current drawn by the amplifier. Thus, the requirements of CDMA may directly conflict with the goal of low power consumption.

Previous attempts to address the strong signal condition have included switching off the low noise amplifier of the receiver down converter. When the low noise amplifier is switched off it acts like an attenuator which would increase the signal handling ability of the telephone. Furthermore, since the low noise amplifier is off the power consumed may be reduced. However, such an approach not meet the performance requirements of CDMA.

Other possible solutions to the strong signal problem may include switching an attenuator in the signal path in the down converter. While this solution may provide a solution to the strong signal problem it would not reduce the power consumption of the down converter.

Similarly, down converter integrated circuits have been developed to accommodate multi-mode wireless telephones. Thus, for example, the RF Micro Devices RF9906 down converter includes adjustable mixer gain which allows for high gain to overcome the higher filter loss of CDMA mode and a low gain for use in AMPS/DAMPS mode. Similarly, the RF9986 device of RF Micro Devices allows for strong signal conditions in CDMA mode by having a switchable third order intercept point which may be increased by 10 db by connecting Vcc to the IP3 pin of the device which causes the LNA current consumption to increase by 10 mA. While these devices allow the wireless telephone to meet the various requirements of the modes of operation of the wireless telephone, there continues to be a need to reduce the down converter's power requirements while still meeting the operational requirements of the wireless telephone.

In view of the above discussion, there exists a need for improvement in power management in wireless telephones while still meeting the signal handling requirements of the modes of operation of the wireless telephone.

SUMMARY OF THE INVENTION

In view of the above discussion, it is an object of the present invention to allow reduced power consumption of a down converter.

A further object of the present invention is to provide a down converter capable of handling strong signal conditions.

Still another object of the present invention is to allow an increase in the battery life of radiotelephones.

Another object of the present invention is to provide a down converter with reduced power consumption in multiple modes of operation of a radiotelephone.

These and other objects of the present invention are provided by methods and systems which control the operation of a receiver of a radiotelephone so as to reduce the power consumption of the receiver by setting the third order intercept point of a low noise amplifier based upon at least one of a strength of a signal received by the radiotelephone or a transmission power of a transmitter of the radiotelephone. Furthermore, the gain of the low noise amplifier may also be set based upon the received signal strength or the transmission power of the transmitter of the radiotelephone. Also, the gain of an amplifier associated with a mixer of the receiver of the radiotelephone may be set based upon the strength of the signal received by the radiotelephone or the transmission power of a transmitter of the radiotelephone.

By adjusting the third order intercept and/or gain of the low noise amplifier and the gain of the mixer amplifier based on the transmitter power or the received signal strength, the performance of the down converter may be adjusted to the operating conditions of the telephone. Furthermore, the gains and third order intercept point may be adjusted to reduce the power consumption of the down converter. Thus, as the signal strength increases the performance of the down converter may be maintained while reducing the power required by the down converter. The total power required to operate the radiotelephone may be decreased and battery life correspondingly increased.

In certain embodiments of the present invention the gains of the low noise amplifier and mixer amplifier of the down converter may be set by bypassing the amplifiers. Thus, the gains are selected between two gain levels for the amplifiers.

In particular embodiments of the present invention, the third order intercept point of the low noise amplifier is set to a low third order intercept point, the gain of the low noise amplifier to a high gain and the gain of the mixer amplifier to a high gain if the transmitter is off.

In alternative embodiments of the present invention in which the radiotelephone is operating in CDMA mode, if the transmitter is operating at an output power above a predefined threshold or the received signal strength is below a predefined threshold, the third order intercept point of the low noise amplifier may be set to a high third order intercept point, the gain of the low noise amplifier set to a high gain and the gain of the mixer amplifier set to a high gain. If the transmitter is operating at an output power below the predefined threshold or the received signal strength is above a predefined threshold, the third order intercept point of the low noise amplifier may also be set to a high third order intercept point, the gain of the low noise amplifier set to a high gain and the gain of the mixer amplifier set to a low gain. The third order intercept point of the low noise amplifier may also be set to a high third order intercept point, the gain of the low noise amplifier set to a high gain and the gain of the mixer amplifier set to a low gain if the transmitter is operating at an output power below the predefined threshold output power and the received signal strength is greater than a first predefined signal strength threshold and less than a second predefined signal strength threshold. The gain of the low noise amplifier may be set to a low gain and the gain of the mixer amplifier set to a high gain if the transmitter is operating at an output power below the predefined threshold output power and the received signal strength is greater than the second predefined signal strength threshold and less than a third predefined signal strength threshold. Finally, the gain of the low noise amplifier may be set to a low gain and the gain of the mixer amplifier to a low gain if the transmitter is operating at an output power below the predefined threshold output power and the received signal strength is greater than the third predefined signal strength threshold.

By providing several thresholds of power conservation, the present invention may provide the high linearity required by the CDMA mode of operation while still reducing the total power consumed by the down converter. Thus, the present invention can allow the down converter to meet the performance criteria of CDMA while still conserving power.

In another embodiment of the present invention, the receiver of the radiotelephone is disabled if the radiotelephone is in sleep mode.

In an embodiment of the present invention where the radiotelephone is operating in Advanced Mobile Phone Service/Digital Advanced Mobile Phone Service(AMPS/DAMPS) mode, the third order intercept point of the low noise amplifier may be set to a low third order intercept point, the gain of the low noise amplifier set to a high gain and the gain of the mixer amplifier set to a low gain if the received signal strength is less than a first predefined signal strength threshold. The third order intercept of the low noise amplifier may be set to a low third order intercept point, the gain of the low noise amplifier set to a high gain and the gain of the mixer amplifier set to a low gain if the received signal strength is greater than the first predefined signal strength threshold an less than a second predefined signal strength threshold. The gain of the low noise amplifier may also be set to a low gain and the gain of the mixer amplifier set to a low gain if the received signal strength is greater than the second predefined signal strength threshold.

In still another embodiment of the present invention, the operation of a receiver of a radiotelephone so as to reduce the power consumption of the receiver by determining the received signal strength of a signal received by the radiotelephone and controlling the power consumption of a down converter of the receiver of the radiotelephone based upon the determined received signal strength. This determination may include determining if the received signal strength is above a first threshold value, if the received signal strength is between the first threshold value and a second threshold value and if the received signal strength is above the second threshold value. The gain of the low noise amplifier may then be set to a low gain and the gain of the mixer amplifier to a low gain if the signal strength is above the second threshold value, the gain of a low noise amplifier of the down converter set to a high gain and the gain of a mixer amplifier of the down converter set to a low gain if the received signal strength is between the first threshold value and the second threshold value and the gain of a low noise amplifier of the down converter set to a high gain and the gain of a mixer amplifier of the down converter set to a high gain if the received signal strength is below the first threshold value. In a particular embodiment, the first threshold value is about −94 dBm, and the second threshold value is about −60 dBm.

By controlling the gains of amplifiers in AMPS/DAMPS mode based upon several threshold values the power consumption of the down converter may be reduced without sacrificing performance.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. As will be appreciated by one of skill in the art, the present invention may be embodied as methods or devices. Accordingly, the present invention may take the form of an entirely hardware embodiment or an embodiment combining software and hardware aspects.

Figure 1:
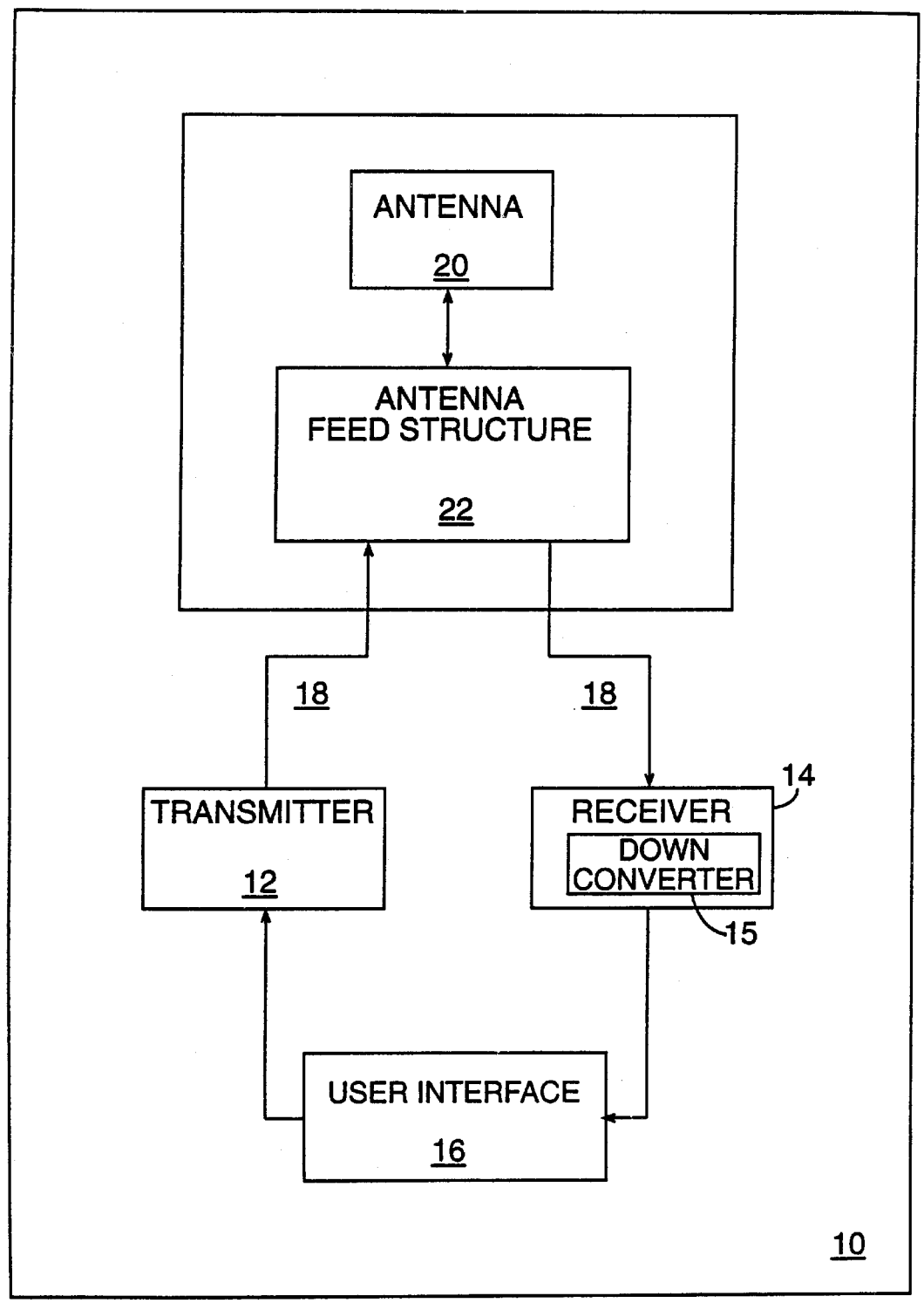
FIG. 1 is a block diagram of a radiotelephone incorporating a down converter of the present invention.

An embodiment of a radiotelephone 10 which includes a down converter 10 according to the present invention is depicted in the block diagram of FIG. 1. As shown in FIG. 1, radiotelephone 10 typically includes a transmitter 12, a receiver 14, a user interface 16 and an antenna system 18. The antenna system 18 may include an antenna feed structure 22 and an antenna 20. As is well known to those of skill in the art, transmitter 12 converts the information which is to be transmitted by radiotelephone 10 into an electromagnetic signal suitable for radio communications. Receiver 14 demodulates electromagnetic signals which are received by radiotelephone 10 so as to provide the information contained in the signals to user interface 16 in a format which is understandable to the user. A wide variety of transmitters 12, receivers 14, user interfaces 16 (e.g., microphones, keypads, rotary dials) which are suitable for use with handheld radiotelephones are known to those of skill in the art, and such devices may be implemented in radiotelephone 10. The design of radiotelephone 10 is well known to those of skill in the art and will not be further described herein.

The present invention relates to the down converter 15 incorporated in receiver 14. As seen in FIG. 1, the radiotelephone 10 includes as part of the receiver 14 a down converter 15. A radiotelephone incorporating the present invention also preferably includes circuitry and programming for measuring the signal strength received by the radiotelephone. Such circuitry and programming are well known to those of skill in the art and, therefore, will not be described in detail herein. Furthermore, it is preferable that such circuitry also contribute to the control of the output power of the transmitter portion of the radiotelephone. Thus, the output power of the transmitter 12 is preferably controlled, at least in part, by the received signal strength such that when the received signal strength is low the output power of the transmitter 12 is high and when the received signal strength is high the output power of the transmitter 12 is reduced.

In operation, a down converter 15 of the present invention utilizes information about the signal conditions and operational state of the radiotelephone to control the operation of the down converter 15 to reduce power consumption. Such control may be accomplished by selectively changing the linearity of an amplifier or amplifiers by changing the third order intercept of an amplifier or amplifiers in the down converter 15, by adjusting the gain of an amplifier or amplifiers in the down converter 15 or by selectively bypassing portions of the down converter 15. One embodiment of a down converter 15 which allows for such control is illustrated in FIG. 2.

Figure 2:
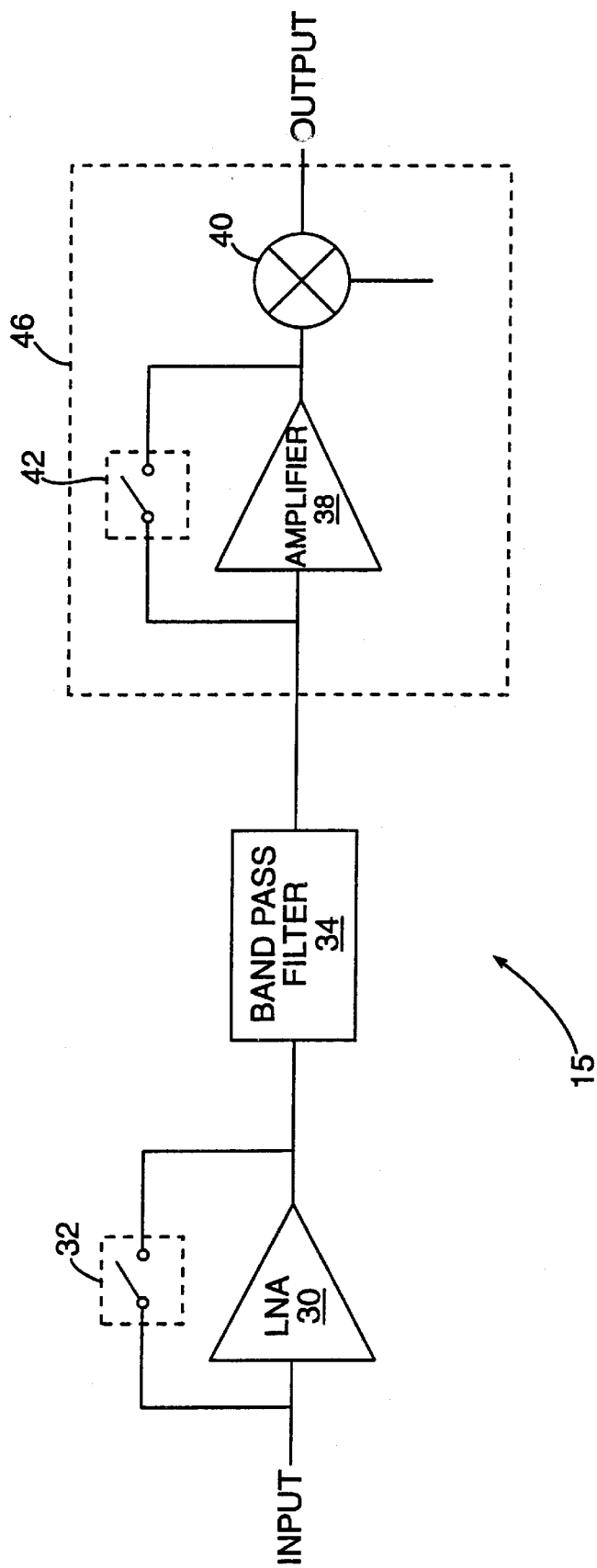
FIG. 2 is a block diagram of a down converter according to the present invention.

As seen in FIG. 2, the down converter 15 preferably includes a low noise amplifier (LNA) 30 which may receive and amplify the incoming signal. A switch 32 allows the LNA 30 to be bypassed. As will be appreciated by those of skill in the art, any number of switching devices may be utilized to bypass the LNA 30 such as a transistor, relay or other such switching devices known to those of skill in the art. By bypassing the LNA 30, the LNA 30 may be disabled so that it draws no power. Accordingly, bypassing LNA 30 may reduce the total power requirements of the radiotelephone 10.

The output of the LNA 30 or the switch 32 is provided to an interstage filter, such as a band pass filter 34 and the output of the filter 34 provided to a variable gain mixer 46. The variable gain mixer 46 is illustrated as having an amplifier component 38 and a mixer component 40. The amplifier 38 of the variable gain mixer 46 may also be bypassed by a switch 42. By bypassing amplifier 38, the amplifier may be disabled so that it does not add to the power requirements of radiotelephone 10.

Amplifiers 30 and 38 may be variable gain amplifiers and amplifier 30 may have an adjustable third order intercept point. Alternatively, fixed gain amplifiers may be utilized and the amplifier bypassed as described herein to provide two gain settings including a high gain when the amplifier is incorporated in the down converter and a low or no gain when the amplifier is bypassed. Amplifiers which provide an adjustable third order intercept point or variable gain include, for example, the PCS Low Noise Amplifier/Mixer RF9986 and the CDMA/FM Low Noise Amplifier/Mixer RF9906 of RF Micro Devices of Greensboro, North Carolina. While these devices may allow for variable gain or variable intercept points, there is no indication of how these devices may be intelligently controlled to provide the optimum tradeoff between power consumption and signal handling over the operating range of the radiotelephone 10. By adjusting the gain and third order intercept point the power requirements of the amplifiers may be adjusted. Thus, for example, by decreasing the third order intercept point of LNA 30 the power required by LNA 30 may be reduced, although, the linearity of LNA 30 may also be reduced by reducing the third order intercept point. Similarly, by reducing the gain of the amplifiers 30 and 38 the power required by these amplifiers may be reduced.

While the present invention is described as bypassing amplifiers 30 and 38 with a switch, as will be appreciated by those of skill in the art, other methods of allowing a signal through the amplifier without requiring the amplifier to be active may be utilized while still benefiting from the teachings of the present invention. Furthermore, the present invention is not limited to two amplifier systems but may be utilized in systems having any number of amplifiers including single amplifier systems such as systems without an amplifier 38 in the mixer 46.

The operation of the present invention will now be described with respect to FIG. 3 which is a flowchart illustrating the operation of a down converter utilizing the present invention. It will be understood that each block of the flowchart illustration, and combinations of blocks in the flowchart illustration, can be implemented by computer program instructions. These program instructions may be provided to a processor to produce a machine, such that the instructions which execute on the processor create means for implementing the functions specified in the flowchart block or blocks. The computer program instructions may be executed by a processor to cause a series of operational steps to be performed by the processor to produce a computer implemented process such that the instructions which execute on the processor provide steps for implementing the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based systems which perform the specified functions or steps, or combinations of special purpose hardware and computer instructions.

Figure 3:
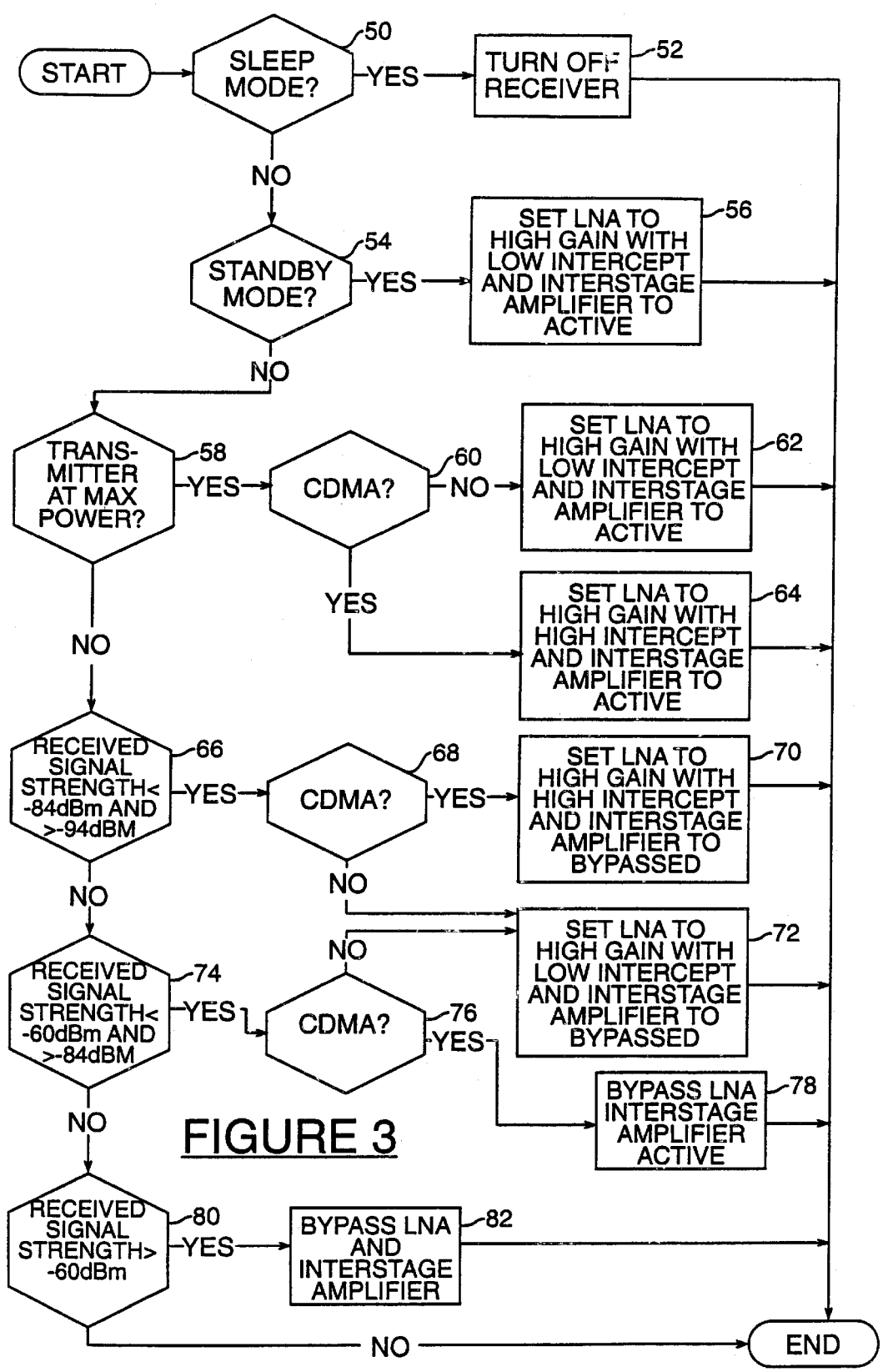
FIG. 3 is a flow chart illustrating operation of a down converter according to the present invention.

FIG. 3 illustrates the operations of a radiotelephone according to the present invention which is capable of operating in either CDMA mode or AMPS/DAMPS mode. As will be appreciated by those of skill in the art, the present invention may be suitable for use in radiotelephones implementing a single communication mode.

As seen in FIG. 3, if the radiotelephone 10 is in sleep mode, then the receiver 14, including the down converter 15, is turned off (blocks 50 and 52). If the radiotelephone 10 is not in sleep mode, then it is determined if the radiotelephone is in standby mode (block 54). If the radiotelephone is in standby mode then the LNA 30 is set to a high gain with a low intercept point and the mixer or inter-stage amplifier 38 is not bypassed (block 56). Thus, switch 32 and switch 42 would both be open. This mode of operation may be used to listen to a base station while the transmitter is turned off and is suitable for either CDMA or AMPS/DAMPS mode of operation. In this mode the current required by the down converter 15 is reduced by using a low third order intercept for the LNA 30. Furthermore, while not illustrated in FIG. 3, if the control channel signal is sufficiently strong, then the down converter 15 may be placed in one of TX-2, TX-3 or TX-4 modes described below.

If the radiotelephone 10 is not in standby mode, then it is determined if the transmitter is transmitting at maximum power (block 58). Alternatively, it could be determined if the received signal strength is below a minimum threshold. If the transmitter is transmitting at maximum power, then it may be determined if the radiotelephone 10 is operating in CDMA mode (block 60). If not, then the radiotelephone is operating in AMPS/DAMPS mode (AMPS/DAMPS Maximum Gain Mode) and the LNA 30 is set to a high gain with a low intercept point and the mixer or inter-stage amplifier 38 is not bypassed (block 62) as described above with regard to standby mode. If, however, the radiotelephone 10 is in CDMA mode (CDMA TX-1 Mode), then the LNA is set to a high gain and a high intercept point and the mixer amplifier 38 is not bypassed (block 64).

If the transmitter is not transmitting at maximum power or the received signal strength is above the minimum threshold, then it is determined if the received signal strength is between −84 and −94 dBm (block 66). If this is the case, then it is determined if the radiotelephone is operating in CDMA mode (block 68). If not, then the radiotelephone is operating in AMPS/DAMPS mode(AMPS/DAMPS Reduced Gain Mode) and the LNA 30 is set to a high gain with a low intercept point and the mixer or inter-stage amplifier 38 is bypassed (block 72). Thus, switch 32 would be open and switch 42 would be closed. This provides a high gain for the LNA 30 and a low gain for the mixer amplifier 38. Because mixer amplifier 38 is bypassed, as described above it may be disabled so that it requires no current. If radiotelephone 10 is in CDMA mode(CDMA TX-2 Mode), the LNA 30 is set to a high gain with a high intercept point and the mixer or inter-stage amplifier 38 is bypassed (block 70) as described above. This mode of operation may be used in full duplex operation with the transmitter in the mid power range.

If the received signal strength is not between −84 and −94 dBm, then it is determined if the received signal strength is between −60 and −84 dBm (block 74). If this is the case, then it is determined if the radiotelephone is operating in CDMA mode (block 76). If not, then the radiotelephone is operating in AMPS/DAMPS mode (AMPS/DAMPS Reduced Gain Mode) and the LNA 30 is set to a high gain with a low intercept point and the mixer or inter-stage amplifier 38 is bypassed (block 72) as described above. If radiotelephone 10 is in CDMA mode(CDMA TX-3 Mode), the LNA 30 is bypassed and the mixer or inter-stage amplifier 38 is active (block 78). Thus, switch 32 would be closed and switch 42 would be open. This provides a low gain for the LNA 30 and a high gain for the mixer amplifier 38. Because LNA 30 is bypassed, as described above it may be disabled so that it requires no current. This mode of operation may be used in full duplex operation with the transmitter in the mid to low power range.

If the received signal strength is not between −60 and −84 dBm, then it is determined if the received signal strength is greater than −60 dBm (block 80). If this is the case, then in either mode (AMPS/DAMPS Minimum Gain Mode, CDMA TX-4 Mode) both the LNA 30 and the mixer amplifier 38 are bypassed and may be disable to draw no current. Thus, switch 32 would be closed and switch 42 would be closed. This provides a low gain for the LNA 30 and a low gain for the mixer amplifier 38. This mode of operation may be used to protect the receiver from high signal levels.

As an example of the operation of the present invention in 1900 MHz CDMA mode, Table 1 illustrates the gain, intercept point (IP) and current drawn for each of the six CDMA modes of operation.

TABLE 1

| | CDMA 1900 MHz Operation | | | | | |
|---|---|---|---|---|---|---|
| Mode | LNA IP (dBm) | LNA Gain (dB) | Mixer Gain (dB) | Receiver Sensitivity (dBM) | Receiver IP (dBm) | Current (ma) |
| Sleep | x | x | x | x | x | 0 |
| Standby | +6 | 14 | 15 | −106.3 | −1.6 | 29.5 |

TABLE 1-continued

| | CDMA 1900 MHz Operation | | | | | |
|---|---|---|---|---|---|---|
| Mode | LNA IP (dBm) | LNA Gain (dB) | Mixer Gain (dB) | Receiver Sensitivity (dBM) | Receiver IP (dBm) | Current (ma) |
| TX-1 | +12 | 14 | 15 | −106.0 | −1.4 | 38 |
| TX-2 | +12 | 14 | 5 | −101.8 | +7.0 | 33 |
| TX-3 | x | −5 | 15 | −92.9 | +16.4 | 26 |
| TX-4 | x | −5 | 5 | −84.2 | +21.2 | 21 |

As an example of the operation of the present invention in 800 MHz AMPS/DAMPS mode, Table 2 illustrates the gain, intercept point and current required for each of the modes of operation.

TABLE 2

| | AMPS/DAMPS 800 MHz Operation | | | | | |
|---|---|---|---|---|---|---|
| Mode | LNA IP (dBm) | LNA Gain (dB) | Mixer Gain (dB) | Receiver Sensitivity (dBM) | Receiver IP (dBm) | Current (ma) |
| Sleep | x | x | x | x | x | 0 |
| Maximum Gain | +7 | 14 | 15 | −118.4 | −15.7 | 25.5 |
| Reduced Gain | +7 | 14 | 5 | −113.7 | −5.8 | 20.5 |
| Minimum Gain | +18 | −5 | 5 | −95.9 | +12.7 | 17 |

As can be seen from FIG. 3, because linearity of the LNA 30 is of less concern in AMPS/DAMPS mode, the power savings, and thus the impact on battery life, may be less than achieved in CDMA mode.

As described herein, changes in third order intercept point are described as setting a "high" third order intercept point and a "low" third order intercept point. While these specific values may change from system to system, the present invention should not be limited to any specific set of values. Furthermore, while particular ranges of signal strength are described herein, the present invention should not be construed as limited to those ranges or to the particular number of power levels described herein. The present invention has been described with respect to CDMA and AMPS/DAMPS but should not be limited to such modes. Finally, while the present invention has been described with respect to a radiotelephone, as will be appreciated by those of skill in the art, the present invention may also be suitable for use in other wireless devices such as a Personal Data Assistant (PDA).

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of controlling the operation of a receiver of a wireless device so as to reduce the power consumption of the receiver, the method comprising:

setting the third order intercept point of a low noise amplifier based upon at least one of a strength of a signal received by the wireless device and a transmission power of a transmitter of the wireless device;

setting the gain of the low noise amplifier based upon at least one of a strength of a signal received by the wireless device and a transmission power of a transmitter of the wireless device;

setting the gain of an amplifier associated with a mixer of the receiver of the wireless device based upon at least one of a strength of a signal received by the wireless device and a transmission power of a transmitter of the wireless device; and wherein the steps of setting the third order intercept point, setting the gain of the low noise amplifier and setting the gain of the mixer amplifier, comprise the step of:
setting the third order intercept point of the low noise amplifier to a low third order intercept point, the gain of the low noise amplifier to a high gain and the gain of the mixer amplifier to a high gain if the transmitter is off.

2. A method according to claim 1, wherein said step of setting the gain of a low noise amplifier comprises the step of selectively bypassing the low noise amplifier.

3. A method according to claim 1, wherein the step of setting the gain of an amplifier associated with a mixer comprises the step of selectively bypassing the amplifier associated with the mixer.

4. A method according to claim 1, further comprising the steps of:
determining if the wireless device is in a sleep mode; and
disabling the receiver if the wireless device is in sleep mode.

5. A method of controlling the operation of a receiver of a wireless device so as to reduce the power consumption of the receiver, the method comprising:
setting the third order intercept point of a low noise amplifier based upon at least one of a strength of a signal received by the wireless device and a transmission power of a transmitter of the wireless device;
setting the gain of the low noise amplifier based upon at least one of a strength of a signal received by the wireless device and a transmission power of a transmitter of the wireless device;
setting the gain of an amplifier associated with a mixer of the receiver of the wireless device based upon at least one of a strength of a signal received by the wireless device and a transmission power of a transmitter of the wireless device; and
wherein the steps of setting the third order intercept point, setting the gain of the low noise amplifier and setting the gain of the mixer amplifier, comprise the step of:
setting the third order intercept point of the low noise amplifier to a high third order intercept point, the gain of the low noise amplifier to a high gain and the gain of the mixer amplifier to a high gain if wireless device is operating in a CDMA mode and the transmitter is operating at an output power above a predefined threshold output power.

6. A method according claim 5, wherein the steps of setting the third order intercept point, setting the gain of the low noise amplifier and setting the gain of the mixer amplifier, further comprise the step of:
setting the third order intercept point of the low noise amplifier to a high third order intercept point, the gain of the low noise amplifier to a high gain and the gain of the mixer amplifier to a low gain if wireless device is operating in a CDMA mode and the transmitter is operating at an output power below the predefined threshold output power.

7. A method according claim 5, wherein the steps of setting the third order intercept point, setting the gain of the low noise amplifier and setting the gain of the mixer amplifier, further comprise the steps of:
setting the third order intercept point of the low noise amplifier to a high third order intercept point, the gain of the low noise amplifier to a high gain and the gain of the mixer amplifier to a low gain if wireless device is operating in a CDMA mode, the transmitter is operating at an output power below the predefined threshold output power and the received signal strength is greater than a first predefined signal strength threshold and less than a second predefined signal strength threshold; and
setting the gain of the low noise amplifier to a low gain and the gain of the mixer amplifier to a high gain if wireless device is operating in a CDMA mode, the transmitter is operating at an output power below the predefined threshold output power and the received signal strength is greater than the second predefined signal strength threshold and less than a third predefined signal strength threshold.

8. A method according claim 7, wherein the steps of setting the third order intercept point, setting the gain of the low noise amplifier and setting the gain of the mixer amplifier, further comprise the step of:
setting the gain of the low noise amplifier to a low gain and the gain of the mixer amplifier to a low gain if the wireless device is operating in a CDMA mode, the transmitter is operating at an output power below the predefined threshold output power and the received signal strength is greater than the third predefined signal strength threshold.

9. A method of controlling the operation of a receiver of a wireless device so as to reduce the power consumption of the receiver, the method comprising:
setting the third order intercept point of a low noise amplifier based upon at least one of a strength of a signal received by the wireless device and a transmission power of a transmitter of the wireless device;
setting the gain of the low noise amplifier based upon at least one of a strength of a signal received by the wireless device and a transmission power of a transmitter of the wireless device;
setting the gain of an amplifier associated with a mixer of the receiver of the wireless device based upon at least one of a strength of a signal received by the wireless device and a transmission power of a transmitter of the wireless device; and
wherein the steps of setting the third order intercept point, setting the gain of the low noise amplifier and setting the gain of the mixer amplifier, comprise the steps of:
setting the third order intercept point of the low noise amplifier to a low third order intercept point, the gain of the low noise amplifier to a high gain and the gain of the mixer amplifier to a low gain if wireless device is operating in a AMPS/DAMPS mode and the received signal strength is greater than a first predefined signal strength threshold and less than a second predefined signal strength threshold; and
setting the gain of the low noise amplifier to a low gain and the gain of the mixer amplifier to a low gain if wireless device is operating in a AMPS/DAMPS mode and the received signal strength is greater than the second predefined signal strength threshold.

10. A down converter for a receiver of a wireless device, comprising:

a low noise amplifier;

means for setting the third order intercept point of the low noise amplifier based upon at least one of a strength of a signal received by the wireless device and a transmission power of a transmitter of the wireless device;

means for setting the gain of the low noise amplifier based upon at least one of a strength of a signal received by the wireless device and a transmission power of a transmitter of the wireless device;

an amplifier associated with a mixer of the receiver;

means for setting the gain of the amplifier associated with a mixer of the receiver of the wireless device based upon at least one of a strength of a signal received by the wireless device and a transmission power of a transmitter of the wireless device; and wherein said means for setting the third order intercept point, means for setting the gain of the low noise amplifier and means for setting the gain of the mixer amplifier, comprise:

means for setting the third order intercept point of the low noise amplifier to a low third order intercept point, the gain of the low noise amplifier to a high gain and the gain of the mixer amplifier to a high gain if the transmitter is off.

11. A down converter according to claim 10, wherein said means for setting the gain of the low noise amplifier comprises means for selectively bypassing the low noise amplifier.

12. A down converter according to claim 11, wherein said means for bypassing comprises a switch.

13. A system according to claim 10, wherein said means for setting the gain of an amplifier associated with the mixer comprises means for selectively bypassing the amplifier associated with the mixer.

14. A down converter according to claim 13, wherein said means for bypassing the amplifier associated with the mixer comprises a switch.

15. A down converter according to claim 10, further comprising:

means for determining if the wireless device is in a sleep mode; and means for disabling the receiver if the wireless device is in sleep mode.

16. A down converter according to claim 10, wherein the wireless device is a radiotelephone.

17. A down converter for a receiver of a wireless device, comprising:

a low noise amplifier;

means for setting the third order intercept point of the low noise amplifier based upon at least one of a strength of a signal received by the wireless device and a transmission power of a transmitter of the wireless device;

means for setting the gain of the low noise amplifier based upon at least one of a strength of a signal received by the wireless device and a transmission power of a transmitter of the wireless device;

an amplifier associated with a mixer of the receiver;

means for setting the gain of the amplifier associated with a mixer of the receiver of the wireless device based upon at least one of a strength of a signal received by the wireless device and a transmission power of a transmitter of the wireless device; and wherein said means for setting the third order intercept point, means for setting the gain of the low noise amplifier and means for setting the gain of the mixer amplifier, comprise:

means for setting the third order intercept point of the low noise amplifier to a high third order intercept point, the gain of the low noise amplifier to a high gain and the gain of the mixer amplifier to a high gain if wireless device is operating in a CDMA mode and the transmitter is operating at an output power above a predefined threshold output power.

18. A down converter according claim 17, wherein said means for setting the third order intercept point, means for setting the gain of the low noise amplifier and means for setting the gain of the mixer amplifier, further comprise:

means for setting the third order intercept point of the low noise amplifier to a high third order intercept point, the gain of the low noise amplifier to a high gain and the gain of the mixer amplifier to a low gain if wireless device is operating in a CDMA mode and the transmitter is operating at an output power below the predefined threshold output power.

19. A down converter according claim 17, wherein said means for setting the third order intercept point, means for setting the gain of the low noise amplifier and means for setting the gain of the mixer amplifier, further comprise:

means for setting the third order intercept point of the low noise amplifier to a high third order intercept point, the gain of the low noise amplifier to a high gain and the gain of the mixer amplifier to a low gain if wireless device is operating in a CDMA mode, the transmitter is operating at an output power below the predefined threshold output power and the received signal strength is greater than a first predefined signal strength threshold and less than a second predefined signal strength threshold; and means for setting the gain of the low noise amplifier to a low gain and the gain of the mixer amplifier to a high gain if wireless device is operating in a CDMA mode, the transmitter is operating at an output power below the predefined threshold output power and the received signal strength is greater than the second predefined signal strength threshold and less than a third predefined signal strength threshold.

20. A down converter according claim 19, wherein said means for setting the third order intercept point, means for setting the gain of the low noise amplifier and means for setting the gain of the mixer amplifier, further comprise:

means for setting the gain of the low noise amplifier to a low gain and the gain of the mixer amplifier to a low gain if wireless device is operating in a CDMA mode, the transmitter is operating at an output power below the predefined threshold output power and the received signal strength is greater than the third predefined signal strength threshold.

21. A down converter for a receiver of a wireless device, comprising:

a low noise amplifier;

means for setting the third order intercept point of the low noise amplifier based upon at least one of a strength of a signal received by the wireless device and a transmission power of a transmitter of the wireless device;

means for setting the gain of the low noise amplifier based upon at least one of a strength of a signal received by the wireless device and a transmission power of a transmitter of the wireless device;

an amplifier associated with a mixer of the receiver;

means for setting the gain of the amplifier associated with a mixer of the receiver of the wireless device based upon at least one of a strength of a signal received by the wireless device and a transmission power of a transmitter of the wireless device; and wherein said means for setting the third order intercept point, means for setting the gain of the low noise amplifier and means for setting the gain of the mixer amplifier, comprise:

means for setting the third order intercept point of the low noise amplifier to a low third order intercept point, the gain of the low noise amplifier to a high gain and the gain of the mixer amplifier to a low gain if wireless device is operating in a AMPS/DAMPS mode and the received signal strength is greater than a first predefined signal strength threshold and less than a second predefined signal strength threshold; and means for setting the gain of the low noise amplifier to a low gain and the gain of the mixer amplifier to a low gain if wireless device is operating in a AMPS/DAMPS mode and the received signal strength is greater than the second predefined signal strength threshold.

* * * * *